United States Patent
Kim et al.

(10) Patent No.: US 10,199,106 B2
(45) Date of Patent: Feb. 5, 2019

(54) REDUCING ERRORS CAUSED BY INTER-CELL INTERFERENCE IN A MEMORY DEVICE

(71) Applicant: Carnegie Mellon University, Pittsburgh, PA (US)

(72) Inventors: Yongjune Kim, Pittsburgh, PA (US); Vijayakumar Bhagavatula, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 0 days.

(21) Appl. No.: 15/515,688

(22) PCT Filed: Sep. 30, 2015

(86) PCT No.: PCT/US2015/053269
§ 371 (c)(1),
(2) Date: Mar. 30, 2017

(87) PCT Pub. No.: WO2016/054241
PCT Pub. Date: Apr. 7, 2016

(65) Prior Publication Data
US 2017/0345503 A1    Nov. 30, 2017

Related U.S. Application Data

(60) Provisional application No. 62/071,698, filed on Sep. 30, 2014.

(51) Int. Cl.
*G11C 16/34* (2006.01)
*G11C 16/04* (2006.01)
(Continued)

(52) U.S. Cl.
CPC .......... *G11C 16/0483* (2013.01); *G06F 11/10* (2013.01); *G06F 11/1012* (2013.01);
(Continued)

(58) Field of Classification Search
CPC . G11C 16/3418; G11C 16/3427; G06F 11/10; G06F 11/1012
(Continued)

(56) References Cited

U.S. PATENT DOCUMENTS

2011/0307670 A1  12/2011  Franceshini et al.
2012/0144272 A1   6/2012  Franceshini et al.
(Continued)

FOREIGN PATENT DOCUMENTS

WO    WO016054241    4/2016

OTHER PUBLICATIONS

Kim et al. "Coding for Memory with Stuck-at Defects"; Electrical and Computer Engineering, Data Storage Systems Center (DSSC), Carnegie Mellon University; Publication [online]. Apr. 17, 2013 [retrieved Nov. 23, 2015]. Retrieved from the Internet: <URL: http://arxiv.org/ftp/arxiv/papers/1304/1304.4821.pdf>; pp. 1-6.
(Continued)

*Primary Examiner* — Hoai V Ho
*Assistant Examiner* — Jay Radke
(74) *Attorney, Agent, or Firm* — Fish & Richardson P.C.

(57) ABSTRACT

A method includes, in one aspect, performing a read operation on a wordline of a memory device, wherein the wordline comprises a plurality of cells that are expected to be in a first state; based on the read operation, identifying one or more of the plurality of cells that are determined to be in a second state that differs from the first state; encoding data using information pertaining to the identified cells to generate a codeword comprising a plurality of bits to be written to the wordline, with at least one of the plurality of bits, which are to be written to at least one of the identified cells, having a value corresponding to the second state; and writing the generated codeword to the wordline.

23 Claims, 6 Drawing Sheets

(51) Int. Cl.
*G06F 11/10* (2006.01)
*G11C 16/10* (2006.01)
*H03M 13/13* (2006.01)
*G11C 7/02* (2006.01)
*G11C 7/10* (2006.01)
*H03M 13/35* (2006.01)

(52) U.S. Cl.
CPC .......... *G06F 11/1048* (2013.01); *G11C 7/02* (2013.01); *G11C 7/1006* (2013.01); *G11C 16/10* (2013.01); *G11C 16/3418* (2013.01); *G11C 16/3427* (2013.01); *H03M 13/13* (2013.01); *H03M 13/353* (2013.01)

(58) Field of Classification Search
USPC ........ 711/154, 155, 103; 365/185.02, 185.17
See application file for complete search history.

(56) References Cited

U.S. PATENT DOCUMENTS

| | | |
|---|---|---|
| 2013/0088923 A1 | 4/2013 | Kang |
| 2013/0238959 A1 | 9/2013 | Birk et al. |
| 2013/0279249 A1 | 10/2013 | Yun et al. |
| 2014/0119113 A1* | 5/2014 | Xia .................. G11C 16/06 365/185.03 |
| 2015/0117097 A1* | 4/2015 | Cai ................... G11C 16/3418 365/185.02 |

OTHER PUBLICATIONS

International Search Report and Written Opinion for Int'l. Appln. No. PCT/US15/53269 dated Dec. 28, 2015 (12 pgs.).

\* cited by examiner

REDUCING ERRORS CAUSED BY INTER-CELL INTERFERENCE IN A MEMORY DEVICE

CROSS-REFERENCE TO RELATED APPLICATIONS

This application is a § 371 National Stage Application of and claims priority to PCT/US2015/053269, filed Sep. 30, 2015, which, in turn, claims the benefit of priority under 35 U.S.C. § 119(e) to provisional U.S. Patent Application No. 62/071,698, filed Sep. 30, 2014, the entire contents of each of which are hereby incorporated by reference.

BACKGROUND

The present disclosure relates to reducing errors caused by inter-cell interference in a memory device.

Storage density of a memory device can be increased by decreasing the size of individual memory cells, decreasing the distance between adjacent (neighboring) memory cells, or both. However, decreasing the size of individual memory cells or decreasing the distance between adjacent memory cells may increase inter-cell interference (ICI) between adjacent memory cells.

SUMMARY

The present disclosure describes systems and methods for reducing errors caused by inter-cell interference in a memory device. In one aspect, a method includes performing a read operation on a wordline of a memory device, wherein the wordline comprises a plurality of cells that are expected to be in a first state. Based on the read operation, one or more of the plurality of cells that are determined to be in a second state that differs from the first state is identified. Data is encoded using information pertaining to the identified cells to generate a codeword that includes a plurality of bits to be written to the wordline, with at least one of the plurality of bits, which are to be written to at least one of the identified cells, having a value corresponding to the second state. The generated codeword is written to the wordline.

Implementations of the disclosure can include one or more of the following features. Performing the read operation on the wordline of the memory device may include performing a pre-read operation using a pre-read voltage on the wordline of the memory device, wherein the plurality of cells of the wordline are expected to be in a first state, and identifying the one or more of the plurality of cells comprises identifying the one or more of the plurality of cells that are determined to be in a second state by determining that a threshold voltage of the one or more of the plurality of cells is higher than the pre-read voltage. The pre-read voltage may differ from a voltage used to read data previously written to the memory device. The memory device may include a flash memory device, and the method may include receiving the data to be written to the wordline of the flash memory device. The flash memory device may include a single-level cell flash memory device, and the method may include receiving the data to be written to the wordline of the single-level cell flash memory device. The memory device may include a phase change memory device, and the method may include receiving the data to be written to the wordline of the phase change memory device. The memory device may include a resistive memory device, and the method may include receiving the data to be written to the wordline of the resistive memory device. Encoding the data may include generating the codeword using a partitioned linear block code. Encoding the data may include determining whether a first parity vector for generating the at least one of the plurality of bits based on locations of all of the one or more identified cells exists; when the first parity vector exists, determining the first parity vector based on the locations of all of the one or more identified cells; when the first parity vector does not exist, selecting a subset of the one or more identified cells; and determining a second parity vector for generating the at least one of the plurality of bits based on locations of the selected subset of the one or more identified cells. A number of elements in the selected subset may be less than a minimum distance for masking defects of a partitioned linear block code. Determining the first or second parity vector for masking defects may include determining the first or second parity vector for masking defects using $$G_0^\Psi d = G_1^\Psi m - (s^+)^\Psi,$$

where $\Psi$ indicates the locations of all of the one or more identified cells or the locations of the selected subset, $G_0^\Psi$ is a first generator matrix, $G_1^\Psi$ is a second generator matrix, $(s^+)^\Psi$ represents side information corresponding to the locations, m is the data to be encoded, and d denotes the first or second parity vector for generating the at least one of the plurality of bits.

All or part of the foregoing may be implemented as a computer program product including instructions that are stored on one or more non-transitory machine-readable storage media, and that are executable on one or more processing devices. All or part of the foregoing may be implemented as an apparatus, method, or system that may include one or more processing devices and memory to store executable instructions to implement the stated functions.

The details of one or more implementations are set forth in the accompanying drawings and the description below. While specific implementations are described, other implementations exist that include operations and components different than those illustrated and described below. Other features, objects, and advantages will be apparent from the description, the drawings, and the claims.

DETAILED DESCRIPTION

Figure 1:
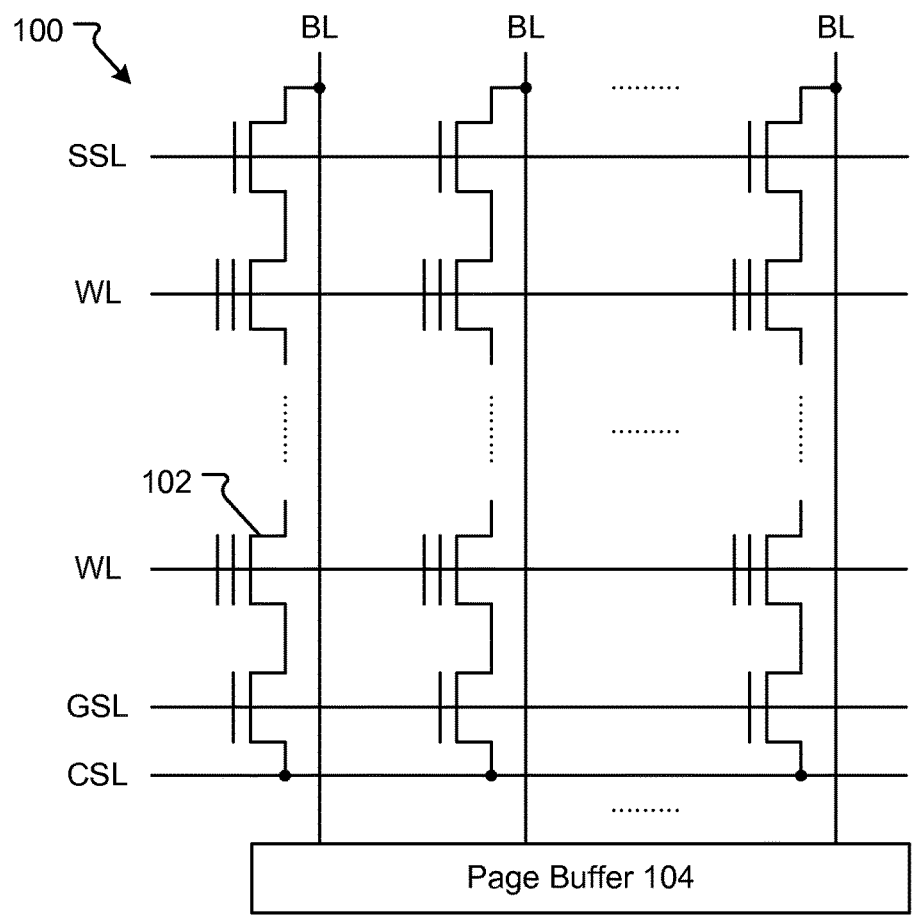
FIG. 1 is a schematic drawing showing an example of a memory block in a flash memory device.

FIG. 1 is a schematic drawing showing an example of a memory block 100 in a flash memory device. As shown in FIG. 1, the memory block 100 is a two-dimensional array of memory cells, including a memory cell 102, connected to a page buffer 104. Each cell is connected to a string select line (SSL), a wordline (WL), a ground select line (GSL), or a common source line (CSL). Each cell is also connected to a bitline (BL). Although a typical flash memory block can include 64 WLs, any suitable number of WLs is possible.

Each memory cell may be a floating gate transistor having a threshold voltage that can be configured by controlling the amount of electron charges in the floating gate. Increasing the electron charges in the floating gate will increase the cell's threshold voltage. For a B-bits per cell memory device, each WL stores B-pages of data. To store B-bits per cell, each cell's threshold voltage distribution is divided into $2^B$ states.

Figure 2:
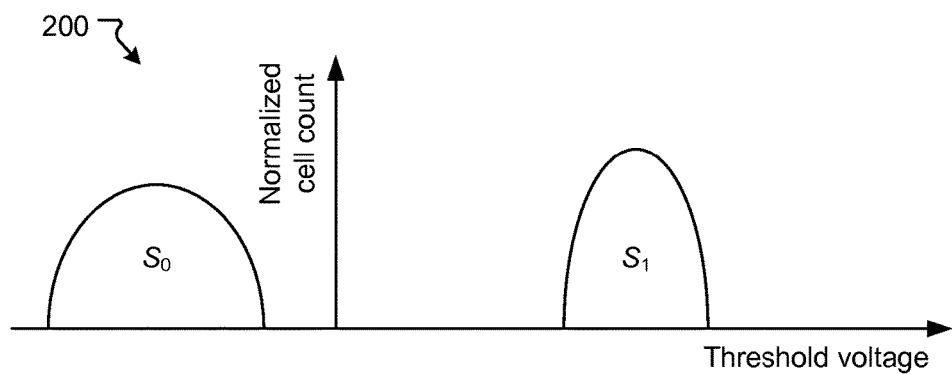
FIG. 2 is a graph showing an example of threshold voltage distribution of memory cells in a single-level cell flash memory device.

FIG. 2 is a graph 200 showing an example of threshold voltage distribution of memory cells of 1-bit per cell flash memory device, also referred to as a single-level cell (SLC) flash memory device. In graph 200, the x-axis represents the voltage threshold distribution and the y-axis represents the normalized cell count of the flash memory device. Initially, all memory cells are erased, so their threshold voltage is in the lowest state $S_0$, also referred to as an erased state. To store data, a cell in state $S_0$ is programmed (or written) so that its threshold voltage is in a higher state $S_1$, also referred to as a programmed state.

Figure 3:
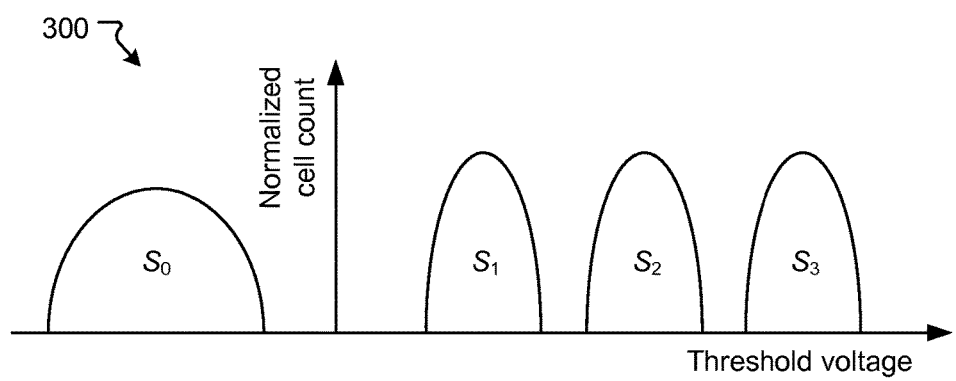
FIG. 3 is a graph showing an example of threshold voltage distribution of memory cells in a multi-level cell flash memory device.

FIG. 3 is a graph 300 showing an example of threshold voltage distribution of memory cells in a multi-level cell (MLC) flash memory device. A MLC flash memory device stores two or more bits per cell. In graph 300, the x-axis represents the voltage threshold distribution and the y-axis represents the normalized cell count of the flash memory device. Initially, all memory cells are erased, so their threshold voltage is in the lowest state $S_0$. A cell can be programmed so that its threshold voltage is in one of the programmed states $S_1, S_2, \ldots, S_{2^B-1}$.

Referring again to FIG. 1, a page of data (within a WL) can be written or read. To perform a write (or program) operation on a memory cell, incremental step pulse programming (ISPP) can be applied to the memory cell with each incremental step resulting in a slight increase of the cell's threshold voltage. The ISPP is based on repeated program and verify cycles with the staircase program voltage $V_{pp}$. Each program state associates with a verify level that is used in the verify operation. During each program and verify cycle, the floating gate threshold voltage is boosted by up to the incremental step voltage $\Delta V_{pp}$ and then compared with the corresponding verify level. If the threshold voltage of the memory cell is still lower than the verify level, the program and verify iteration continues. Otherwise, further programming of this cell is disabled.

The positions of program states are determined by verify levels, and the tightness of each program state depends on the incremental step voltage $\Delta V_{pp}$. By reducing $\Delta V_{pp}$, the threshold voltage distribution can be made tighter, but the write time may increase.

To perform a read operation, the threshold voltages of cells in the same WL are compared with a given read level. After the read operation, a page of binary data is transferred to the page buffer 104. The binary data indicates whether the threshold voltage of each cell in the WL is lower or higher than the read level. Because the read operation of flash memory is a binary decision, multiple read operations are required to obtain a soft decision value, which lowers the read speed. The degradation of read speed may be a challenge for soft decision decoding and signal processing.

The threshold voltage of a flash memory cell can be reduced by an erase operation. In a flash memory device, all memory cells in the same flash memory block, e.g., block 100, may be erased at the same time. The erase operation moves the threshold voltage of the cells into the lowest state $S_0$.

As described above, a page of data (within a WL) can be written, and a block of data can be erased at the same time. In addition, the threshold voltage of cell is moved into the lowest state $S_0$ by an erase operation, whereas a slight increase of threshold voltage is possible by ISPP during a write operation. These unique properties of flash memory cause asymmetry between write and erase operations.

Figure 4:
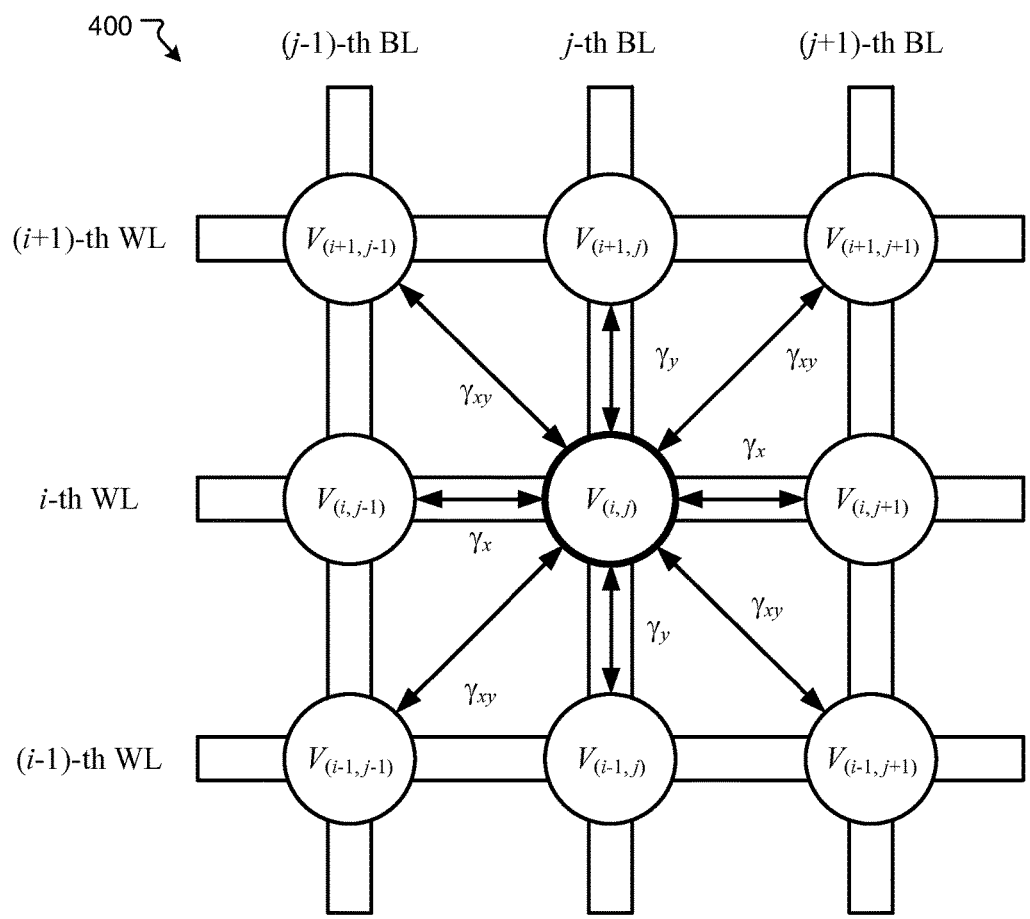
FIG. 4 is a diagram showing an example of inter-cell interference between adjacent cells in a memory device.

In flash memory, the threshold voltage shift of one cell, e.g., as a result of being programmed, affects the threshold voltage of its adjacent cell because of inter-cell interference (ICI). The ICI may be attributed to parasitic capacitances coupling effect between adjacent cells. FIG. 4 is a diagram 400 showing an example of the ICI between adjacent cells in a flash memory device. $V_{(i,j)}$ is the threshold voltage of the (i,j) cell which is situated at the i-th WL and the j-th BL. $\gamma_x$ is the t-directional coupling ratio between a BL and an adjacent BL. Also, $\gamma_y$ is the y-directional coupling ratio between a WL and an adjacent WL. Finally, $\gamma_{xy}$ is the xy-directional (diagonal) coupling ratio. These coupling ratios depend on parasitic capacitances between adjacent cells. As the cell size becomes smaller or the distances between cells become smaller, the parasitic capacitances may become larger. The increase of parasitic capacitances causes the increase of the coupling ratios.

The threshold voltage shift $\Delta_{ICI}V_{(i,j)}$ of the (i,j) cell due to the ICI may be given by $$\Delta_{ICI}V_{(i,j)} = \gamma_x(\Delta V_{(i,j-1)} + \Delta V_{(i,j+1)}) + \gamma_y(\Delta V_{(i-1,j)} + \Delta V_{(i+1,j)}) + \gamma_{xy}(\Delta V_{(i-1,j-1)} + \Delta V_{(i-1,j+1)} + \Delta V_{(i+1,j-1)} + \Delta V_{(i+1,j+1)})$$

where $\Delta V_{(i\pm 1, j\pm 1)}$ in the right hand side of the above equation represent the threshold voltage shifts of adjacent cells after the (i,j) cell has been programmed. The ICI that happens before writing to the (i,j) cell can be compensated by several write schemes so long as the (i,j) cell is being written into a programmed state. Note that the ICI to the (i,j) cell that is to remain in state $S_0$ cannot be compensated by these write schemes since a cell that is to remain in $S_0$ is never programmed.

Figure 5:
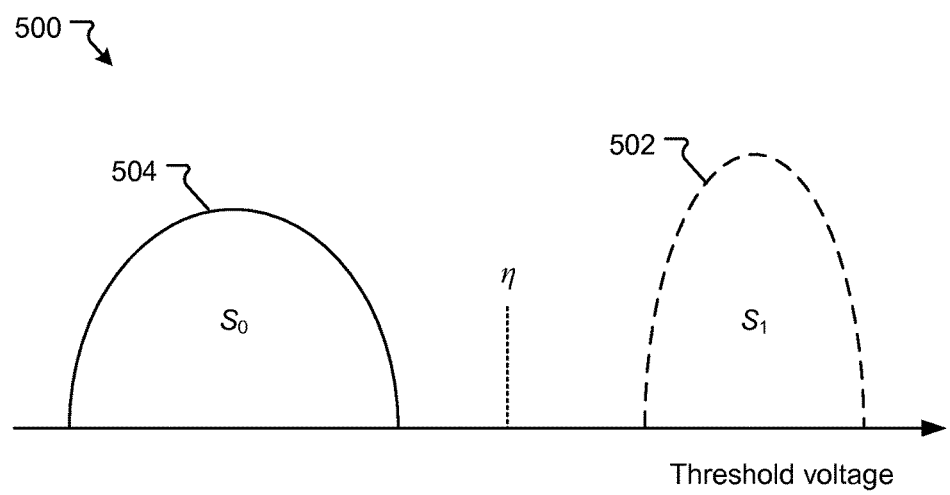
FIG. 5 is a graph showing an example of threshold voltage distribution of memory cells in the i-th WL before writing the (i−1)-th WL of the memory device shown in FIG. 4.

FIG. 5 is a graph 500 showing an example of threshold voltage distribution of single-level memory cells in the i-th WL before writing the (i−1)-th WL of the memory device shown in FIG. 4. In graph 500, the x-axis represents the voltage threshold distribution and the y-axis represents the normalized cell count of the memory device. The dashed curve 502 represents the designated threshold voltage distributions for state $S_1$. The solid curve 504 represents a current threshold voltage distribution for state $S_0$. Initially, all cells in the i-th WL have threshold voltages in the erased state $S_0$.

Figure 6:
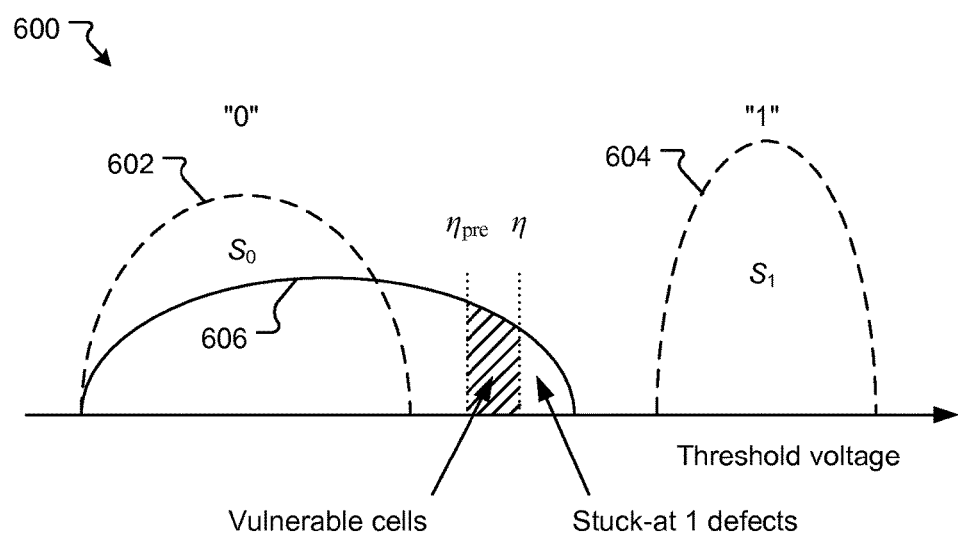
FIG. 6 is a graph showing an example of threshold voltage distribution of memory cells in the i-th WL after writing the (i−1)-th WL and before writing the i-th WL of the memory device shown in FIG. 4.

FIG. 6 is a graph 600 showing an example of threshold voltage distribution of the single-level memory cells in the i-th WL after writing the (i 1)-th WL and before writing the i-th WL of the memory device shown in FIG. 4. In graph 600, the x-axis represents the voltage threshold distribution and the y-axis represents the normalized cell count of the memory device. The dashed curve 602 represents the designated threshold voltage distributions for state $S_0$. The dashed curve 604 represents the designated threshold voltage distributions for state $S_1$. The solid curve 606 represents a current threshold voltage distribution for state $S_0$. After writing the adjacent (i−1)-th WL, the threshold voltages of cells in the i-th WL will be distorted, as shown by the curve 606, due to the ICI from the (i−1)-th WL. Thus, the threshold voltages of some cells in the i-th WL may be higher than the given read level $\eta$ though the i-th WL has yet to be written.

In a memory device where state $S_0$ denotes the data "0" and state $S_1$ denotes the data "1", only a "1" can be written into a cell. If a "0" is attempted to be written to a cell, an error will result. Thus, the threshold voltage of flash memory cells cannot be reduced using a write operation. To decrease the threshold voltage of a cell in the i-th WL, an erase operation may be performed on the whole flash memory block that includes the i-th WL, which may not be desirable. Thus, cells in the i-th WL with threshold voltages that are higher than the read level $\eta$ cannot be programmed into state $S_0$ and are thus always in state $S_1$. Such cells may be regarded as stuck-at 1 defects.

Figure 7:
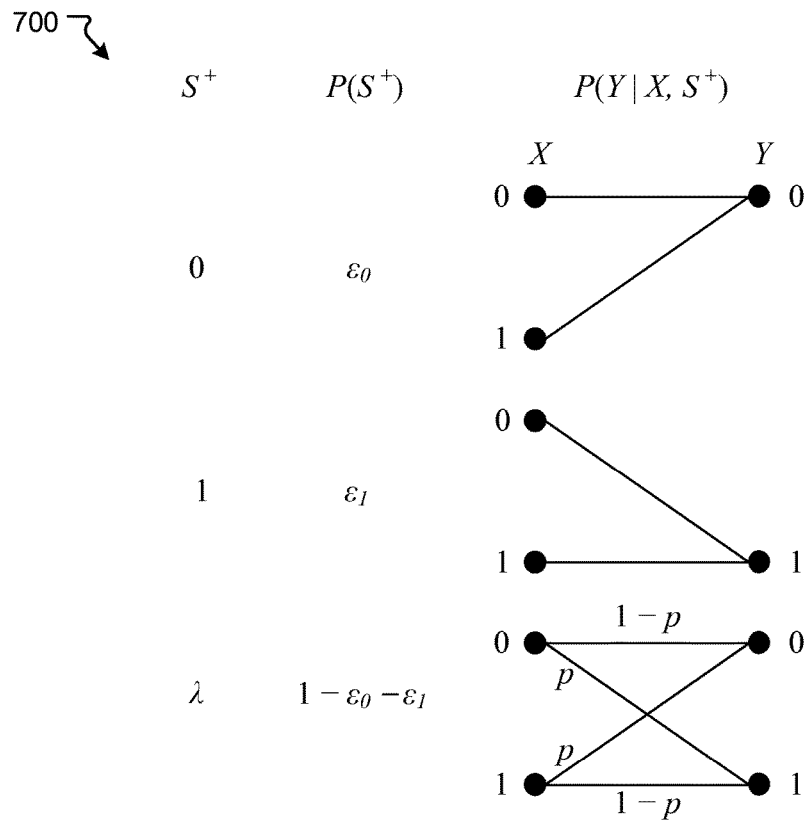
FIG. 7 is a diagram showing an example of a channel model for a memory having defective cells.

A binary memory cell may be called a defective cell if its cell value is stuck-at a particular value regardless of the channel input. FIG. 7 is a diagram showing an example of a channel model 700 for a memory having defective cells. The channel model 700 has a ternary defect information $S^+ \in \{0,1,\lambda\}$ whereas the channel input X and output Y are binary. The state $S^+=0$ corresponds to a stuck-at 0 defect that always outputs a 0 independent of its input value, the state $S^+=1$ corresponds to a stuck-at 1 defect that always outputs a 1, and the state $S^+=\lambda$ corresponds to a normal cell that can be modelled by a binary symmetric channel (BSC) with crossover probability p. The probabilities of these states (namely 0, 1, and $\lambda$) are $\varepsilon_0, \varepsilon_1$, and $1-\varepsilon_0-\varepsilon_1$, respectively.

Figure 8:
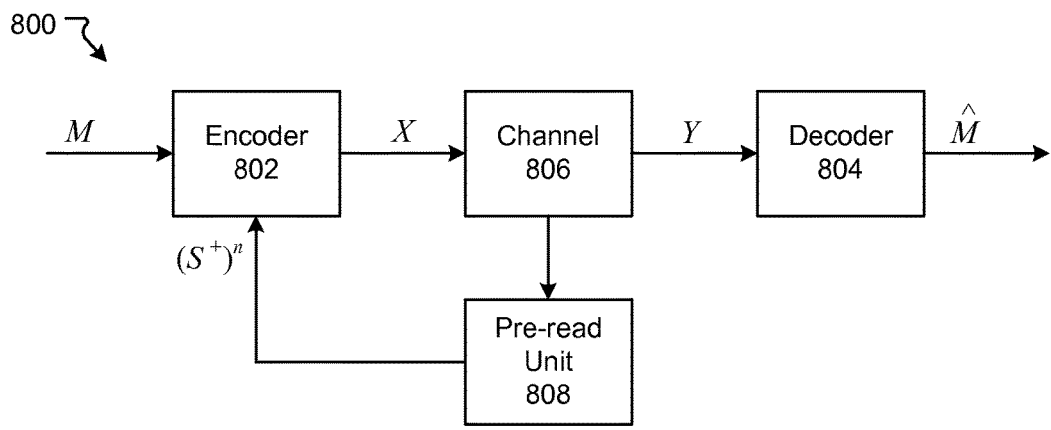
FIG. 8 is a block diagram showing an example of a system for reducing errors caused by ICI in a memory device.

FIG. 8 is a block diagram showing an example of a system 800 for reducing errors caused by ICI in a memory device. The system 800 includes an encoder 802, a decoder 804, a channel 806, and a pre-read unit 808. FIG. 8 will be described in conjunction with FIG. 9, which is a flowchart of an example of a process 900 for reducing errors caused by ICI in a memory device. The process 900 may be performed by the system 800 shown in FIG. 8.

Suppose that $S^n$ represents the ICI of n memory cells. Because it may be a challenge to determine $S^n$ due to properties of the memory device, the channel 806 with the ICI may be modelled using a channel with defective cells. The encoder 802 may use the side information of defects $(S^+)^n$, rather than the side information of ICI $S^n$, to improve the decoding failure probability.

Figure 9:
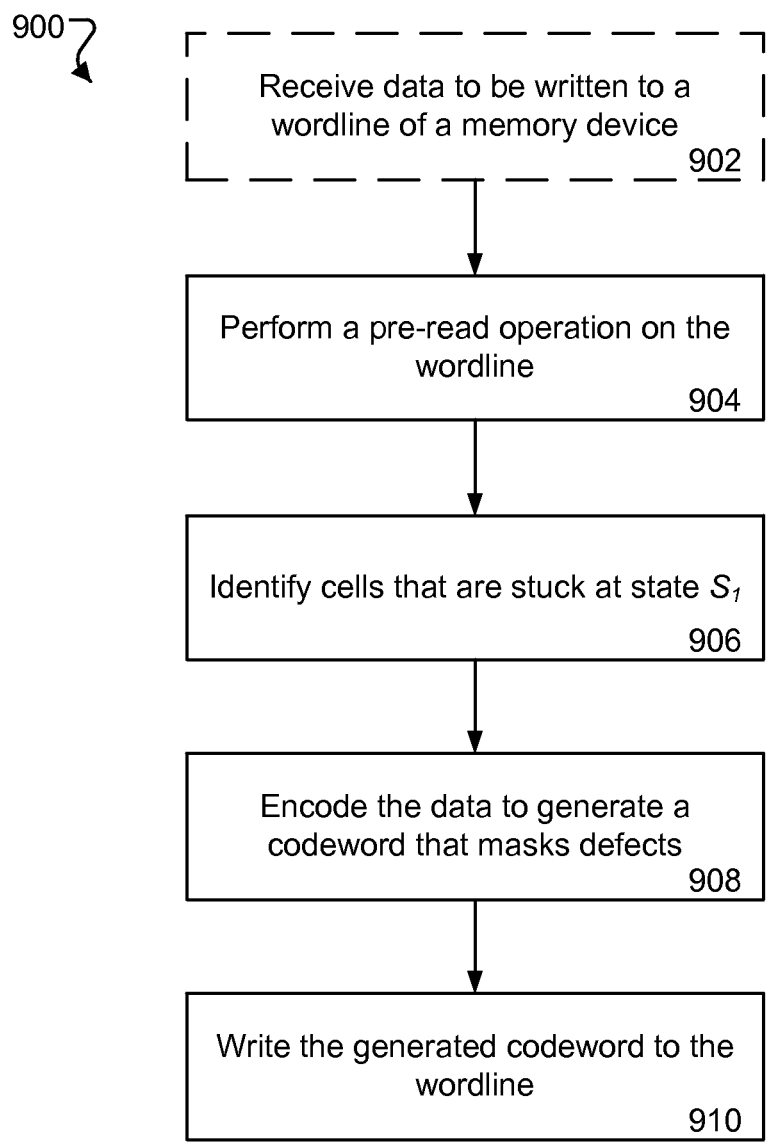
FIG. 9 is a flowchart of an example of a process for reducing errors caused by ICI in a memory device.

The side information of defects $(S^+)^n$ for the i-th WL may be obtained by a pre-read operation performed by the pre-read unit 808 (FIG. 9 at 904). The pre-read operation may be performed after receiving data and before writing the data to the i-th WL (FIG. 9 at 902). The pre-read operation is performed at a given read level. When the read level for the pre-read operation, referred to as the pre-read level $\eta_{pre}$, is the same as the read level $\eta$ for reading data, the cells having threshold voltages that are higher than the read level $\eta$, and thus regarded as stuck at state $S_1$, can be identified by the pre-read operation (FIG. 9 at 906). The pre-read unit 808 provides the side information of defects $(S^+)^n$ to the encoder 802. Because the pre-read unit 808 obtains the side information through a single read operation of the wordline, the system 800 does not experience a degradation of read speed.

The side information of defects $(S^+)^n$ may contain partial information about the ICI of n memory cells, referred to as $S^n$. $(S^+)^n$ is binary because it is obtained from one pre-read operation. In addition, $(S^+)^n$ does not reveal the ICI from the (i+1)-th WL and the x-directional ICI, which are subsequent ICI since the pre-read operation is performed before the write operation of the i-th WL and the (i+1)-th WL. However, this partial knowledge of $(S^+)^n$ may improve the probability of decoding failure.

Referring to FIG. 6, the ICI from the (i+1)-th WL and the x-directional ICI may be compensated by changing the read level $\eta_{pre}$ for the pre-read operation, e.g., selecting the pre-read level $\eta_{pre}$ to be lower than the read level $\eta$. A cell whose threshold voltage is between $\eta_{pre}$ and $\eta$ is a vulnerable cell though it is not a stuck-at 1 defect. When the data "0" is written to this cell, the ISPP cannot change the threshold voltage of this cell and its threshold voltage is near $\eta$. Thus, it may be vulnerable to the subsequent ICI and read noise. On the other hand, the cell's threshold voltage will be higher than a verify level of $S_1$ by the ISPP when the data "1" is written to this cell. Note that the verify level of $S_1$ is higher than the read level $\eta$. Thus, by setting a pre-read level such that $\eta_{pre} < \eta$, the cells whose threshold voltages are higher than the pre-read level $\eta_{pre}$ may be regarded as stuck-at 1 defects. By selecting a lower pre-read level, more noise margin between $S_0$ and $S_1$ may be obtained and the subsequent ICI and read noise may be prevented.

Referring again to FIG. 8, the encoder 802 encodes the data to generate a codeword (FIG. 9 at 908). The encoder 802 may use an additive encoding approach to mask defects by adding a selected binary vector. Masking defects refers to selecting a codeword whose values at the locations of defects match the stuck-at values of the defects at those locations, e.g., only the data "1" will be written to the cells with the stuck-at 1 defects. Additive encoding may be implemented using [n,k,l] partitioned linear block codes (PLBC) that mask stuck-at defects and correct random errors. Although [n,k,l] PLBC for flash memory will be described, other suitable encoding techniques that mask defects may be used. After generating the codeword, the codeword is written to the wordline of the memory device (FIG. 9 at 910).

By using one pre-read operation before writing, the flash memory channel 806 with the ICI may be represented by the following channel model of binary memory with defective cells:

$$Y = X \circ S^+ + Z$$

where X, Y, and Z are the binary channel input, output, and additive noise, respectively. The binary channel input X and the ternary defect information $S^1$ are shown in FIG. 7. Let $\circ$ denote the operator $\circ: \{0,1\} \times \{0,1,\lambda\} \to \{0,1\}$ by $$x \circ s^+ = \begin{cases} x, & \text{if } s^+ = \lambda; \\ s^+, & \text{if } s^+ \neq \lambda \end{cases}$$

where $x \in X$ and $s^+ \in S^+$.

Referring to FIG. 8, the vector version of the output Y of the channel 806 for an n-cell memory is given by $$y = x \circ s^+ + z$$

where x, y, $z \in \{0,1\}^n$ are the binary channel input vector (e.g., the data vector to be stored in the memory), output vector, and random error vector, respectively. Also, the defect vector $s^+ \in (S^+)^n$ represents the side information, or channel state information, of defect locations and stuck-at values. Both ∘ and + are the vector component-wise operators. + denotes the addition over Galois field (GF) which may be replaced by XOR.

The number of defects in n cells is equal to the number of non-$\lambda$ components in $s^+$. The number of errors due to defects is given by $$\|x \circ s^+ - x\|$$

where $\|\cdot\|$ is the Hamming weight (the number of non-zero elements) of the vector. The [n,k,l] PLBC is a pair of linear subspaces $\mathcal{C}_1 \subset \{0,1\}^n$ and $\mathcal{C}_0 \subset \{0,1\}^n$ of dimension k and l such that $\mathcal{C}_1 \cap \mathcal{C}_0 \subset \{0\}$. Then the direct sum is given by $$\mathcal{C} = \mathcal{C}_1 + \mathcal{C}_0 = \{c = c_1 + c_0 | c_1 \in \mathcal{C}_1, c_0 \in \mathcal{C}_0\}.$$

The encoder 802 encodes a message M represented by vector $m \in \{0,1\}^k$ to a corresponding codeword X represented by vector $c \in \mathcal{C}$ using $$c = G_1 m + G_0 d = [G_1\ G_0]\begin{bmatrix} m \\ d \end{bmatrix} = \tilde{G}\begin{bmatrix} m \\ d \end{bmatrix}$$

where $c_1 = G_1 m \in \mathcal{C}_1$ and $c_0 = G_0 d \in \mathcal{C}_0$. The generator matrix $G_1$ is an n×k matrix, and the generator matrix $G_0$ is an n×l matrix. Thus, $\mathcal{C}$ can be regarded as an [n,k+l] linear block code (LBC) with the generator matrix $\tilde{G} = [G_1 G_0]$.

The parity vector $d \in \{0,1\}^l$ for masking defects determines the binary vector $c_0$ masking stuck-at defects. The encoder 802 may select d by considering both $c_1$ and $s^+$. The optimal d may be selected to minimize the number of errors due to defects, given by $\|c \circ s^+ - c\|$ where $\|z\|$ denotes the number of nonzero elements in z.

A pair of minimum distances $(d_1, d_0)$ of an [n,k,l] PLBC are given by $$d_1 = \min_{\substack{m \neq 0 \\ \tilde{H}^T x = 0}} \|c\|$$

$$d_0 = \min_{\substack{c \neq 0 \\ G_0^T c = 0}} \|c\|$$

where $d_1$ is greater than or equal to the minimum distance of the [n,k+l] LBC with parity check matrix H, while $d_0$ is the minimum distance of the [n,k+r] LBC with parity check matrix $G_0$. The minimum distance $d_1$ may be used to correct random errors, and the minimum distance $d_0$ may be used to mask defects. An [n,k,l] PLBC with minimum distances $(d_1, d_0)$ is a u defect, t error correcting code if $u < d_0$ and $2t < d_1$ or if $u \geq d_0$ and $2(u+t+1-d_0) < d_1$. If $u < d_0$, all defects will be successfully masked and $\|c \circ s^+ - c\| = 0$. Otherwise, it may be that $\|c \circ s^+ - c\| \neq 0$ which may result in a masking failure. The unmasked defects may be regarded as random errors in the decoder 804.

The encoding of PLBC includes an implicit optimization problem where d may be found by solving $$G_0^{\Psi_u} d = G_1^{\Psi_u} m - (s^+)^{\Psi_u}$$

where $\Psi_u = \{i_1, \ldots, i_u\}$ indicates the set of locations of u defects obtained from the side information $(s^+)^{\Psi_u} = (s_{i_1}, \ldots, s_{i_u})$. Also, $$G_0^{\Psi_u} = \begin{bmatrix} g_{0,i_1} \\ \vdots \\ g_{0,i_u} \end{bmatrix} \text{ and } G_1^{\Psi_u} = \begin{bmatrix} g_{1,i_1} \\ \vdots \\ g_{1,i_u} \end{bmatrix}$$

where $g_{0,i}$ and $g_{1,i}$ are the i-th row of $G_0$ and $G_1$, respectively. If the number of defects $u < d_0$, the optimal d may be found by Gaussian elimination or another suitable method for linear equations. However, the PLBC encoding algorithm for more than $d_0 - 1$ defects is an optimization problem with exponential computational complexity.

Since the computational complexity for finding the optimal d may be exponential, the encoder 802 may use the following two-step encoding scheme for determining d:

Step 1:
Try to solve $G_0^{\Psi_u} d = G_1^{\Psi_u} m - (s^+)^{\Psi_u}$
If d exists, go to end.
Otherwise, go to step 2.

Step 2:
Select $d_0 - 1$ locations among u defects and define $\Psi_{d_0-1} = \{i_1, \ldots, i_{d_0-1}\}$.
Solve $$G_0^{\Psi_{d_0-1}} d = G_1^{\Psi_{d_0-1}} m - (s^+)^{\Psi_{d_0-1}}$$

End

If d is found in step 1, the number of unmasked defects will be zero and $\|c \circ s^+ - c\| = 0$. If d is found in step 2, $0 < \|c \circ s^+ - c\| \leq u - (d_0 - 1)$. The $d_0 - 1$ locations may be selected in descending order from higher degree element because unmasked defects of higher degree than $G_0$ result in error multiplication during the decoding operation.

To decode the codeword, the decoder 804 retrieves Y represented by the vector $y = x \circ s^+ + z$ where $x = c$ and where z denotes the random errors. The decoder 804 computes the syndrome $w = \tilde{H}^T y$ (where superscript T denotes transpose) and selects $\hat{z} \in \{0,1\}^n$ which minimizes $\|z\|$ subject to $\tilde{H}^T z = w$. Then the decoder 804 computes an estimated message $\hat{M}$ represented by the vector $\hat{m} = \tilde{G}_1^T \hat{c}$ where $\hat{c} = y + \hat{z}$. The parity check matrix $\tilde{H}$ is an n×r matrix such that $\tilde{H}^T \tilde{G} = 0_{r,k+l}$ (the r×(k+l) zero matrix) and k+l+r=n. The message inverse matrix $\tilde{G}_1$ is defined as an n×k matrix such that $\tilde{G}_1^T G_1 = I_k$ (the k-dimensional identity matrix) and $\tilde{G}_1^T G_0 = 0_{k,l}$.

Interference can happen in nonvolatile memory devices as well as other high-density data storage systems. For example, phase change memories suffer from thermal interference between adjacent cells. Also, magnetic recording systems suffer from inter-symbol interference, which is similar to ICI. Thus, the techniques described in this specification can be applied to any data storage system suffering from interference, such as flash memory, phase change memory, and resistive memory.

Systems can be implemented in digital electronic circuitry, or in computer hardware, firmware, software, or in combinations thereof. An apparatus can be implemented in a computer program product tangibly embodied or stored in a machine-readable storage device for execution by a programmable processor; and method actions can be performed by a programmable processor executing a program of instructions to perform functions by operating on input data and generating output. The implementations described herein, and other implementations, can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object oriented programming language, or in assembly or machine language if desired; and in any case, the language can be a compiled or interpreted language.

Processors suitable for the execution of a computer program include, by way of example, both general and special purpose microprocessors, and any one or more processors of any kind of digital computer. Generally, a processor will receive instructions and data from a read-only memory or a random-access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. Computer readable media for embodying computer program instructions and data include all forms of non-volatile memory, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in special purpose logic circuitry. Any of the foregoing can be supplemented by, or incorporated in, ASICs (application-specific integrated circuits).

Other implementations are within the scope and spirit of the description and the claims. Additionally, due to the nature of software, functions described above can be implemented using software, hardware, firmware, hardwiring, or combinations of any of these. Features implementing functions may also be physically located at various positions, including being distributed such that portions of functions are implemented at different physical locations. The use of the term "a" herein and throughout the application is not used in a limiting manner and therefore is not meant to exclude a multiple meaning or a "one or more" meaning for the term "a." Additionally, to the extent priority is claimed to a provisional patent application, it should be understood that the provisional patent application is not limiting but includes examples of how the techniques described herein may be implemented.

What is claimed is:

1. A method comprising:
   in response to receiving an instruction to write data to a wordline of a memory device, performing a read operation on the wordline of the memory device, wherein the wordline comprises a plurality of cells that are expected to be in a first state;
   based on the read operation, identifying one or more of the plurality of cells that are each determined to not be in the first state;
   in response to the identifying, adaptively encoding the data using information pertaining to the identified cells to generate a codeword comprising a plurality of bits to be written to the wordline, with at least one of the plurality of bits, which are to be written to at least one of the identified cells, having a value corresponding to a second state that differs from the first state; and
   writing, during a write operation that writes the data to the wordline of the memory device, the generated codeword to the wordline to cause the at least one of the identified cells to be in the second state.

2. The method of claim 1, wherein:
   performing the read operation on the wordline of the memory device comprises performing a pre-read operation using a pre-read voltage on the wordline of the memory device, wherein the plurality of cells of the wordline are expected to be in a erased state; and
   identifying the one or more of the plurality of cells comprises identifying the one or more of the plurality of cells that are determined to be in a programmed state by determining that a threshold voltage of the one or more of the plurality of cells is higher than the pre-read voltage.

3. The method of claim 2, wherein the pre-read voltage differs from a voltage used to read data previously written to the memory device.

4. The method of claim 1, wherein the memory device comprises a flash memory device, and the method further comprises:
   receiving the data to be written to the wordline of the flash memory device.

5. The method of claim 4, wherein the flash memory device comprises a single-level cell flash memory device, and the method further comprises:
   receiving the data to be written to the wordline of the single-level cell flash memory device.

6. The method of claim 1, wherein the memory device comprises a phase change memory device, and the method further comprises:
   receiving the data to be written to the wordline of the phase change memory device.

7. The method of claim 1, wherein the memory device comprises a resistive memory device, and the method further comprises:
   receiving the data to be written to the wordline of the resistive memory device.

8. The method of claim 1, wherein encoding the data comprises generating the codeword using a partitioned linear block code.

9. The method of claim 1, wherein encoding the data comprises:
   determining whether a first parity vector for generating the at least one of the plurality of bits based on locations of all of the one or more identified cells exists;
   when the first parity vector exists, determining the first parity vector based on the locations of all of the one or more identified cells;
   when the first parity vector does not exist, selecting a subset of the one or more identified cells; and
   determining a second parity vector for generating the at least one of the plurality of bits based on locations of the selected subset of the one or more identified cells.

10. The method of claim 9, wherein a number of elements in the selected subset is less than a minimum distance for masking defects of a partitioned linear block code.

11. The method of claim 9, wherein determining the first or second parity vector for masking defects comprises determining the first or second parity vector for masking defects using $$G_0^\Psi d = G_1^\Psi m - (s^+)^\Psi,$$

where $\Psi$ indicates the locations of all of the one or more identified cells or the locations of the selected subset, $G_0^\Psi$ is a first generator matrix, $G_1^\Psi$ is a second generator matrix, $(s^+)^\Psi$ represents side information corresponding to the locations, m is the data to be encoded, and d denotes the first or second parity vector for generating the at least one of the plurality of bits.

12. A system comprising:
    a memory device comprising a wordline, with the wordline comprising a plurality of cells that are expected to be in a first state; and a flash controller configured to perform operations comprising:

in response to receiving an instruction to write data to a wordline of a memory device, performing a read operation on the wordline of the memory device, wherein the wordline comprises a plurality of cells that are expected to be in a first state;

based on the read operation, identifying one or more of the plurality of cells that are each determined to not be in the first state;

in response to the identifying, adaptively encoding the data using information pertaining to the identified cells to generate a codeword comprising a plurality of bits to be written to the wordline, with at least one of the plurality of bits, which are to be written to at least one of the identified cells, having a value corresponding to a second state that differs from the first state; and writing, during a write operation that writes the data to the wordline of the memory device, the generated codeword to the wordline to cause the at least one of the identified cells to be in the second state.

13. The system of claim 12, wherein:

performing the read operation on the wordline of the memory device comprises performing a pre-read operation using a pre-read voltage on the wordline of the memory device, wherein the plurality of cells of the wordline are expected to be in an erased state; and identifying the one or more of the plurality of cells comprises identifying the one or more of the plurality of cells that are determined to be in a programmed state by determining that a threshold voltage of the one or more of the plurality of cells is higher than the pre-read voltage.

14. The system of claim 13, wherein the pre-read voltage differs from a voltage used to read data previously written to the memory device.

15. The system of claim 12, wherein the memory device comprises a flash memory device, and the flash controller is configured to perform operations comprising:

receiving the data to be written to the wordline of the flash memory device.

16. The system of claim 15, wherein the flash memory device comprises a single-level cell flash memory device, and the flash controller is configured to perform operations comprising:

receiving the data to be written to the wordline of the single-level cell flash memory device.

17. The system of claim 12, wherein the memory device comprises a phase change memory device, and the flash controller is configured to perform operations comprising:

receiving the data to be written to the wordline of the phase change memory device.

18. The system of claim 12, wherein the memory device comprises a resistive memory device, and the flash controller is configured to perform operations comprising:

receiving the data to be written to the wordline of the resistive memory device.

19. The system of claim 12, wherein encoding the data comprises generating the codeword using a partitioned linear block code.

20. The system of claim 12, wherein encoding the data comprises:

determining whether a first parity vector for generating the at least one of the plurality of bits based on locations of all of the one or more identified cells exists;

when the first parity vector exists, determining the first parity vector based on the locations of all of the one or more identified cells;

when the first parity vector does not exist, selecting a subset of the one or more identified cells; and determining a second parity vector for generating the at least one of the plurality of bits based on locations of the selected subset of the one or more identified cells.

21. The system of claim 20, wherein a number of elements in the selected subset is less than a minimum distance for masking defects of a partitioned linear block code.

22. The system of claim 20, wherein determining the first or second parity vector for masking defects comprises determining the first or second parity vector for masking defects using $$G_0^\Psi d = G_1^\Psi m - (s^+)^\Psi,$$

where $\Psi$ indicates the locations of all of the one or more identified cells or the locations of the selected subset, $G_0^\Psi$ is a first generator matrix, $G_1^\Psi$ is a second generator matrix, $(s^+)^\Psi$ represents side information corresponding to the locations, m is the data to be encoded, and d denotes the first or second parity vector for generating the at least one of the plurality of bits.

23. A system comprising:

a flash memory device comprising a wordline, with the wordline comprising a plurality of cells that are expected to be in an erased state; and a flash controller configured to perform operations comprising:

performing a pre-read operation using a pre-read voltage on the wordline of the flash memory device, wherein the pre-read voltage differs from a read voltage used to read data previously written to the flash memory device;

based on the pre-read operation, identifying one or more of the plurality of cells that have a threshold voltage that is higher than the pre-read voltage, wherein the higher threshold voltage indicates that the identified one or more cells are in a programmed state;

determining whether a first parity vector based on locations of all of the one or more identified cells exists;

when the first parity vector exists, determining the first parity vector based on the locations of all of the one or more identified cells;

when the first parity vector does not exist, selecting a subset of the one or more identified cells, wherein a number of elements in the selected subset is one less than a minimum distance for masking defects of a partitioned linear block code (PLBC);

determining a second parity vector based on locations of the selected subset of the one or more identified cells, wherein the first or second parity vector is determined using $$G_0^\Psi d = G_1^\Psi m - (s^+)^\Psi,$$

where $\Psi$ indicates the locations of all of the one or more identified cells or the locations of the selected subset, $G_0^\Psi$ is a first generator matrix of a partitioned linear block code (PLBC), $G_1^\Psi$ is a second generator matrix of the PLBC, $(s^+)^\Psi$ represents side information corresponding to the locations, m is data to be encoded, and d denotes the parity vector;

encoding data using the parity vector to generate a codeword comprising a plurality of bits to be written to the wordline, with at least one of the plurality of bits, which are to be written to at least one of the identified cells, having a value corresponding to the programmed state; and writing the generated codeword to the wordline.

\* \* \* \* \*